(12) United States Patent
Akhssay et al.

(10) Patent No.: US 12,078,938 B2
(45) Date of Patent: Sep. 3, 2024

(54) METHOD AND APPARATUS FOR PREDICTING ABERRATIONS IN A PROJECTION SYSTEM

(71) Applicant: ASML Netherlands B.V., Veldhoven (NL)

(72) Inventors: Mhamed Akhssay, Helmond (NL); Laurentius Johannes Adrianus Van Bokhoven, Bergeijk (NL)

(73) Assignee: ASML Netherlands B.V., Veldhoven (NL)

( * ) Notice: Subject to any disclaimer, the term of this patent is extended or adjusted under 35 U.S.C. 154(b) by 465 days.

(21) Appl. No.: 17/438,314

(22) PCT Filed: Feb. 10, 2020

(86) PCT No.: PCT/EP2020/053292
§ 371 (c)(1),
(2) Date: Sep. 10, 2021

(87) PCT Pub. No.: WO2020/182386
PCT Pub. Date: Sep. 17, 2020

(65) Prior Publication Data
US 2022/0187715 A1     Jun. 16, 2022

(30) Foreign Application Priority Data

Mar. 12, 2019  (EP) ..................................... 19162154
Mar. 22, 2019  (EP) ..................................... 19164607

(51) Int. Cl.
*G03F 7/00* (2006.01)

(52) U.S. Cl.
CPC .......... *G03F 7/706* (2013.01); *G03F 7/70504* (2023.05); *G03F 7/70891* (2013.01)

(58) Field of Classification Search
CPC ................................................... G03F 7/70504
See application file for complete search history.

(56) References Cited

U.S. PATENT DOCUMENTS 10,503,083 B2   12/2019  Schattenburg et al.
11,428,521 B2   8/2022   Bhattacharyya et al.
(Continued)

FOREIGN PATENT DOCUMENTS

CN   107148597 A   9/2017
CN   108292093 A   7/2018
(Continued)

OTHER PUBLICATIONS

International Search Report and Written Opinion of the International Searching Authority directed to related International Patent Application No. PCT/EP2020/053292, mailed May 20, 2020; 10 pages.
(Continued)

*Primary Examiner* — Steven H Whitesell
(74) *Attorney, Agent, or Firm* — Sterne, Kessler, Goldstein & Fox P.L.L.C.

(57) ABSTRACT

A method of predicting thermally induced aberrations of a projection system for projecting a radiation beam, the method comprising: calculating a change in temperature of the projection system from a power of the radiation beam output from the projection system using a dynamic linear function; and calculating the thermally induced aberrations from the calculated change in temperature using a static non-linear function.

20 Claims, 14 Drawing Sheets

(56) References Cited

U.S. PATENT DOCUMENTS

| | | |
|---|---|---|
| 2013/0050674 A1 | 2/2013 | Prosyentsov et al. |
| 2014/0030087 A1 | 1/2014 | Soria et al. |
| 2014/0204353 A1 | 7/2014 | Ozawa |
| 2014/0300876 A1 | 10/2014 | Baer et al. |

FOREIGN PATENT DOCUMENTS

| | | |
|---|---|---|
| EP | 1513017 A1 | 3/2005 |
| WO | WO2013/056941 A1 | 4/2013 |
| WO | WO2017/207512 A2 | 12/2017 |
| WO | WO2018/184783 A1 | 10/2018 |

OTHER PUBLICATIONS

International Preliminary Report on Patentability directed torelated International Patent Application No. PCT/EP2020/053292, issued Aug. 25, 2021; 7 pages.

Jeng et al., "Control strategies for thermal budget and temperature uniformity in spike rapid thermal processing systems," Computers and Chemical Engineering, 57:141-150, Jan. 24, 2013.

Mao et al., "Modeling and optimization oflens heating effect for litho graphic projector," Journal of Micro/Nanolithography, MEMS, and MOEMS, 17(2):1-12, Apr. 2018.

METHOD AND APPARATUS FOR PREDICTING ABERRATIONS IN A PROJECTION SYSTEM

CROSS-REFERENCE TO RELATED APPLICATIONS

This application claims priority of EP application number 19162154.9 which was filed on 12 Mar. 2019 and of EP application number 19164607.4 which was filed on 22 Mar. 2019 and which are incorporated herein in their entirety by reference.

FIELD

The present invention relates to a method and apparatus for predicting aberrations in a projection system. More particularly, the method relates to modelling projection system heating that result in thermally induced aberrations.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

The projection system which is used to image the pattern from a patterning device onto the substrate will induce some aberrations in the wavefront of the projected image.

During the projection of the pattern onto the substrate, the projection system will heat up, and this will cause the imaging properties of the projection system to drift. In EUV lithography, this phenomenon is called mirror heating. The aberrations caused by the mirror heating depend on the application in the lithographic apparatus, which will have a particular radiation illumination mode, patterning device and product stack. Furthermore, diffraction caused by the patterning device will also affect the aberrations.

It is an object of the invention to provide a method for predicting and modelling aberrations which obviates or mitigates one or more problems associated with the prior art.

SUMMARY

According to a first aspect of the invention, there is provided a method of predicting thermally induced aberrations of a projection system for projecting a radiation beam, the method comprising: calculating a change in temperature of the projection system from a power of the radiation beam output from the projection system using a dynamic linear function; and calculating the thermally induced aberrations from the calculated change in temperature using a static non-linear function.

This may have an advantage that the thermally induced aberrations in the projection system may be predicted simply, accurately, quickly and at a reduced cost. The nonlinear effects of relatively large temperature changes in the projection system may be modelled. Furthermore, using the model may avoid having to sample the wavefront of the radiation beam at substrate level, which is time consuming and results in productivity loss.

The dynamic linear function may be $x(k)=x(k-1)\exp(-dt/\tau)+P(k)\mu/\tau$, with a first set of parameters: $\mu$ being amplitude, $\tau$ being time constant, $P$ being the power of the radiation beam output from the projection system and $x$ representing the change in temperature.

The static non-linear function may be $y(x)=ax^2+bx+c$, with a second set of parameters: a, b, and c of the exponential relation and y representing the thermally induced aberrations.

This may have an advantage that only 5 parameters need to be estimated in the model. The model may be simple and easy to calibrate.

The method may further comprise determining $\mu$ and $\tau$ of the first set of parameters of the dynamic linear function and a, b and c of the second set of parameters of the static non-linear function using a non-linear optimization routine.

The dynamic linear function may be application dependent and the static non-linear function may be application independent.

The method may further comprise predicting thermally induced aberrations for different applications during lot transition by adding the response of the dynamic linear function of a first application and the response of the dynamic linear function of a second application together and then evaluating the static non-linear response using the static non-linear function.

The method may further comprise: passing the radiation beam through the projection system to expose one or more exposure fields on a substrate and measuring the aberrations of the projection system caused by the radiation beam; and using the measurement of the aberrations of the projection system to calibrate the dynamic linear function and the static non-linear function.

The method may further comprise measuring the aberrations by measuring at least one of focus offset, field curvature, astigmatism offset, astigmatism curvature and registration marks from the exposed substrate, and measuring the intensity and/or wavefront of the radiation beam output from the projection system using a sensor.

The method may further comprise calibrating the dynamic linear function and the static non-linear function using only one substrate.

According to a second aspect of the present invention there is provided a method of adjusting a lithographic apparatus to compensate for the thermally induced aberrations and/or the drift of thermally induced aberrations of a projection system of the lithographic apparatus, the method comprising using the predicted aberrations of the method as described above in an open loop control system. An advantage of this is that aberrations drift will be compensated for and so yield loss will be reduced.

According to a third aspect of the present invention there is provided a lithographic apparatus comprising a projection system configured to project a radiation beam to project a pattern from a patterning device onto a substrate, wherein the lithographic apparatus is configured to predict thermally induced aberrations of the projection system by: using a dynamic linear function to calculate a change in temperature of the projection system from a power of the radiation beam output from the projection system using a dynamic linear function; and using a static non-linear function to calculate the thermally induced aberrations from the calculated change in temperature.

The lithographic apparatus may be configured to: make measurements of thermally induced aberrations of the projection system caused by the radiation beam being passed through the projection system to expose one or more exposure fields on the substrate; and use the measurement of the aberrations of the projection system to calibrate the dynamic linear function and the static non-linear function.

The lithographic apparatus may be configured to use the predicted aberrations in an open loop control system to compensate for the aberrations and/or the drift in the aberrations of the projection system.

The lithographic apparatus may be an EUV lithographic apparatus and the projection system may comprise mirrors.

According to a fourth aspect of the invention there is provided a computer program comprising computer readable instructions configured to cause a processor to carry out a method as described above.

According to a fifth aspect of the invention there is provided a computer readable medium carrying a computer program as described above.

According to a sixth aspect of the invention there is provided a computer apparatus for predicting thermally induced aberrations of a projection system comprising: a memory storing processor readable instructions; and a processor arranged to read and execute instructions stored in said memory; wherein said processor readable instructions comprise instructions arranged to control the computer to carry out a method as described above.

BRIEF DESCRIPTION OF THE DRAWINGS

Embodiments of the invention will now be described, by way of example only, with reference to the accompanying schematic drawings, in which:

FIG. 11b depicts a schematic diagram of a substrate used in the mirror heating qualification test of FIG. 11a.

DETAILED DESCRIPTION

Figure 1:
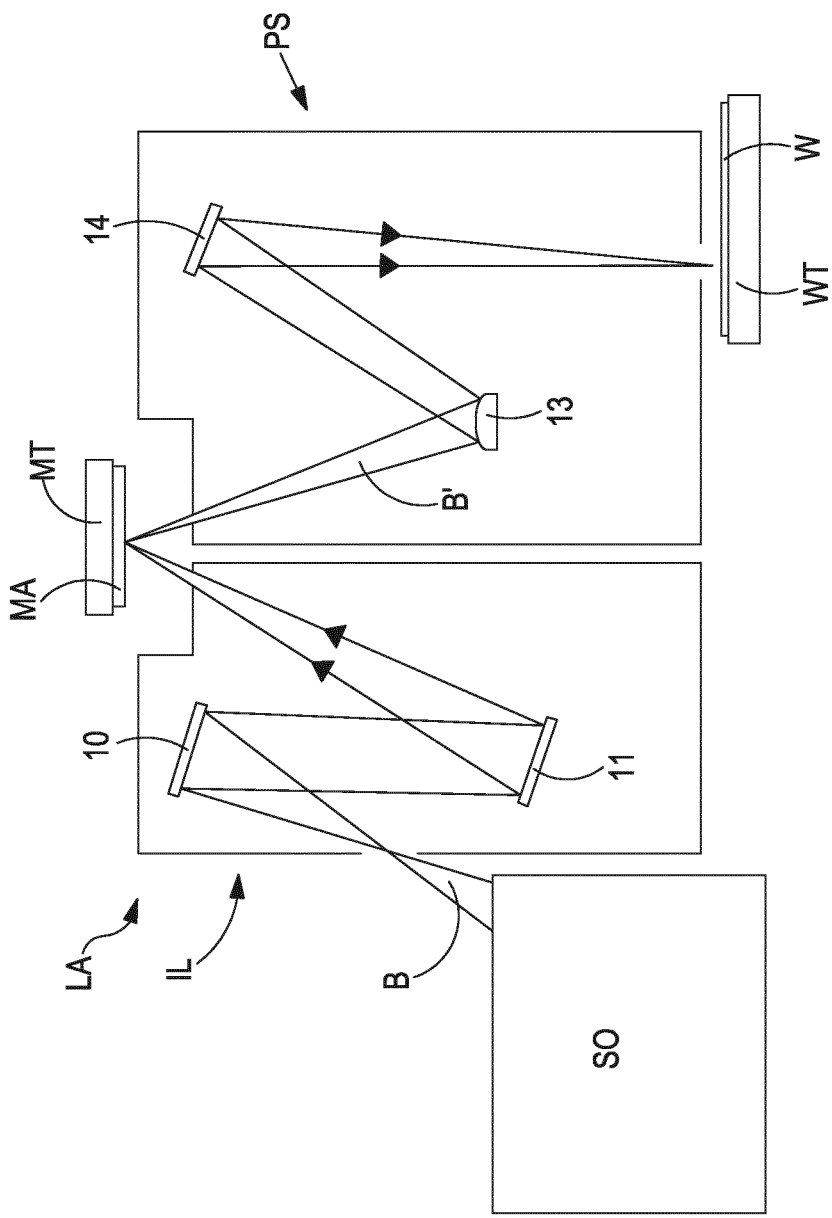
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Figure 2:
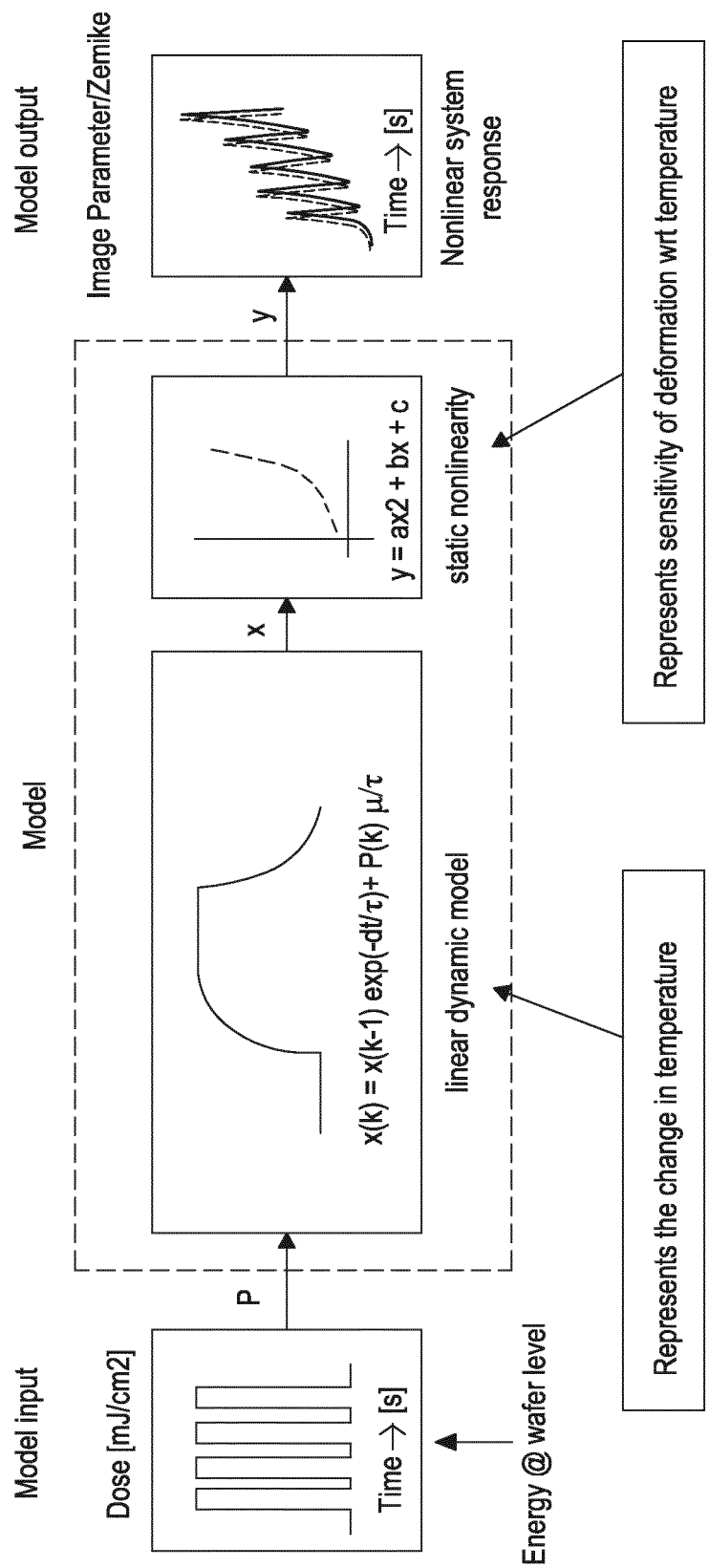
FIG. 2 depicts a schematic diagram of a projection system heating model according to an embodiment of the invention.

FIG. 2 depicts a schematic diagram of a mirror heating model for the projection system PS of the EUV lithographic apparatus LA. The mirrors 13, 14 of the projection system PS heat up as the EUV radiation beam B' pass through the projection system PS and the model predicts the resulting thermally induced aberrations of the projection system PS.

The input of the model is a power P of the radiation beam B' output from the projection system PS. For example, this may be the power (i.e. heat load) as a function of time at substrate level, i.e. at the location of the substrate W on the substrate table WT. The energy at substrate level is measured for a period of time and this is used to calculate the power P. The power P may be predetermined and the lithographic apparatus LA may keep the power P at the predetermined level. Energy dose at substrate level is controlled using a feedback method. Control error can be neglected and therefore using energy setpoints at substrate level may be sufficient. Thus, the power P may not need to be measured after the projection system PS.

The model may be a Wiener model. A Wiener model may be used as a basis for system identification for non-linear systems. A Wiener model consists of a linear dynamic element followed by a static non-linear element. The first part of the model of FIG. 2, a first submodel, is a linear dynamic model. The output parameter of the linear dynamic model is an intermediate state, x. The parameter x represents the change in temperature of the projection system which is calculated from the power P input to the model. The change in temperature may be described using a linear exponential function:

$$x(k)=x(k-1)\exp(-dt/\tau)+P(k)\mu/\tau \qquad (1)$$

Where $\mu$ is the amplitude (nm) and $\tau$ is the time constant (s) of the exponential response. Thus, a first set of parameters for the model is x, representing the change in temperature, P, being the power of the radiation beam output from the projection system, $\mu$, being amplitude and $\tau$, being time constant.

It will be appreciated that the linear exponential function (1) is just an example and other models may be used to describe the dynamic response. For example, in other embodiments, a step response function, an impulse response function, a state space function, or a Laplace transform function may be used. The step response of a system in a given initial state consists of the time evolution of its outputs when its control inputs are Heaviside step functions. An impulse response is the reaction of a dynamic system in response to some external change, e.g. a brief input signal, called an impulse. The impulse response describes the reaction of the system as a function of time. Step response is the time behavior of the outputs of a system when its inputs change from zero to one in a very short time. A state space function is a mathematical model of the system as a set of input, output and state variables related by first-order differential equations or difference equations. State variables are variables whose values evolve through time in a way that depends on the values they have at any given time and also depends on the externally imposed values of input variables. The Laplace transform takes a function of a real variable t (often time) to a function of a complex variable s (complex frequency).

One part, "x(k−1)exp(−dt/$\tau$)", of the linear exponential function (1) represents the cooling down effect of the projection system PS, while the other part, "P(k)$\mu$/$\tau$", of the linear exponential function (1) represents the heating up of the projection system PS.

Once the intermediate state x (the change in temperature) has been calculated by the first submodel, the next step is to convert the temperature effect into the thermally induced aberrations y, i.e. the wave front deformation of the radiation beam B' caused by the mirror heating. The aberrations may for example be expressed as a set of Zernikes. For example, Zernike coefficients $Z_2$ to $Z_{25}$ of the field orders offset, tilt, curvature and third order may be used to express the aberrations. Thus, a description of the state of the projection system PS may have 96 coefficients (24×4). In other examples, other ranges of Zernike coefficients may be used. For example Zernike coefficients from $Z_5$, up to $Z_{64}$, up to $Z_{77}$, or up to $Z_{100}$ may be used.

The second part of the model, a second submodel, is a static non-linear model. The output parameter of the static non-linear model is the thermally induced aberrations y. The wave front deformation (thermally induced aberrations) is a non-linear static function of the temperature of the projection system PS. Thus, the sensitivity of deformation with respect to temperature may be described using a static non-linear function:

$$y(x)=ax^2+bx+c \qquad (2)$$

Where a, b and c are parameters of the exponential relation between intermediate state x and an arbitrary Zernike (model output) Zi. Thus, a second set of parameters for the model are a, b, and c of the exponential relation and y representing the thermally induced aberrations.

The model of FIG. 2 has 5 parameters to be estimated. That is, $\mu$ amplitude (nm) and $\tau$ time constant (s) of the first set of parameters, and a, b and c of the second set of parameters. These parameters may be estimated using a non-linear optimization routine, such as a Levenberg-Marquardt.

In other embodiments, methods other than Levenberg-Marquardt may be used to estimate the parameters possible. It is also possible to loop over the parameter space and calculate which combination gives the best description of calibration data, although this may be less efficient. The quadratic relation may also be calibrated by setting the system in different steady state levels. In that case, there is a direct relation between input signal and model output. A hybrid method is also possible: Quadratic relation can be also determined using a physical model that describes the thermo-mechanical response. Another hybrid possibility is to determine the dynamic response using a physical model that describes the thermal behaviour of the system. The calibration is then used to determine only the quadratic static relation. Note that the quadratic relation can be described using a different approach, such as a look up table with interpolation, a spline method, or a higher order polynomial with more parameters to estimate.

As the EUV radiation beam B' passes through the projection system PS, the mirrors 13, 14 of the projection system PS will heat up, and this will cause the imaging properties of the projection system PS to drift. The mirrors 13, 14 may heat up by several degrees Kelvin. This is a relatively large increase in temperature, e.g. when compared with deep ultraviolet (DUV) lens heating which occurs only in the milli Kelvin (mK) range. The temperature effects due to the EUV radiation means that the heating effects are non-linear and so linear model calibration and prediction techniques do not hold. In EUV mirror heating, the increased temperature means that for the thermally induced aberrations a response may be quadratic with respect to temperature. That is, a temperature change will stretch/deform the mirrors 13, 14 of the projection system PS, which will change in imaging properties in a quadratic relation.

The model shown in FIG. 2 may be used to predict the thermally induced aberrations in the mirrors 13, 14 of the projection system PS of an EUV lithographic apparatus LA in a similar way as models have been used to predict thermally induced aberrations in DUV lens heating. In order to control lens heating in DUV systems, a prediction model is used that predicts and compensates the drift using lens manipulators. The prediction model is calibrated per application on a lithographic apparatus. An application on a lithographic apparatus may be defined by the patterning device used, the illumination mode and the product stack. The product stack is the substrate (wafer) W with already existing device (chip) layers printed on it. So the substrate W has already had multiple passes and etch instances. The radiation that is reflected back into the projection system PS may need to be taken into account. The reflection depends on what is already on the wafer W. The prediction model may be calibrated using the heating response by exposing the particular application.

The model of FIG. 2 may be calibrated and used in a control loop method, (similar to a lens heating open loop control method) to account for the thermally induced aberrations in the projection system PS of the EUV lithographic apparatus LA. In some embodiments, the lithographic apparatus LA may be adjusted to compensate for the thermally induced aberrations and/or the drift of the thermally induced aberrations of the projection system PS. This may be by using an open loop control system which uses the control loop method. The control loop may be a combination of open loop (high sample frequency, prediction for each exposure) and closed loop, once per wafer W or once per lot only. The aberrations may be controlled using aberration manipulators in the projection system PS, e.g. moving lens elements, wafer stage and reticle stage positions. Also, thermal conditioning of the projection system PS may be used.

An advantage of using the model of FIG. 2 is that aberrations drift will be compensated for and so yield loss will be reduced. In addition, using the model avoids having to sample the wavefront of the radiation beam B' at substrate level (e.g. adding in extra inline wave front measurements (e.g. sensors) in the production sequence), which is time consuming and results in productivity loss. An advantage of using the control loop method is avoiding measurements, which reduce productivity, by relying on the prediction model only.

Figure 3:
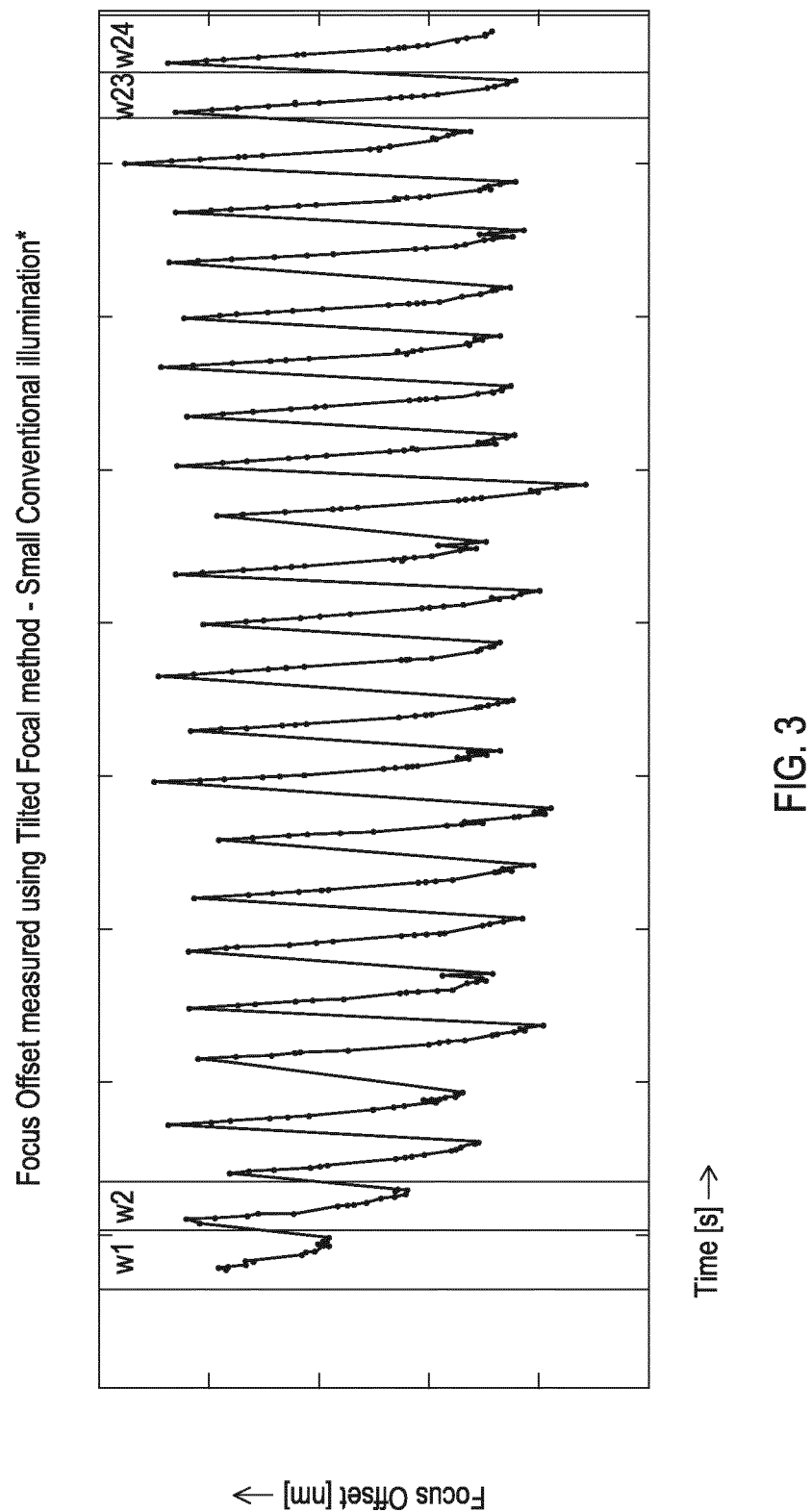
FIG. 3 depicts a graph of focus offset data for a projection system heating model according to an embodiment of the invention.

FIG. 3 shows a graph of Focus offset data (resist data) of 24 substrates W which have been used to fit and validate the model of FIG. 2. In practice, 25 substrates W may be used. In other embodiments, a different number of substrates may be used. The Focus offset may be measured using the system and method as described in WO2013/056941A1 using a small conventional illumination mode which has the same dose of radiation for each exposure.

Figure 4:
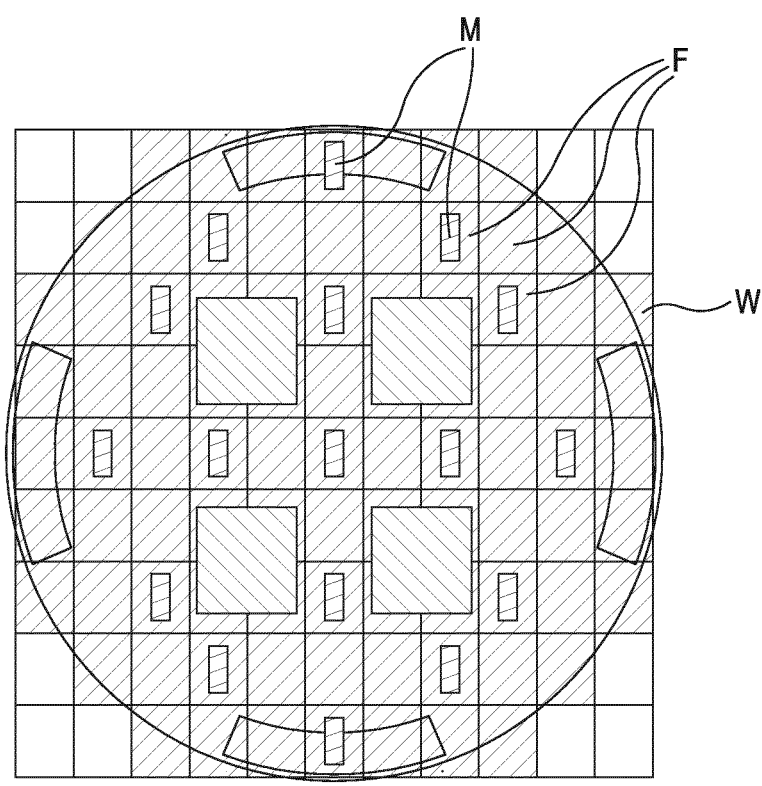
FIG. 4 depicts a schematic diagram of the substrate being exposed for data for a projection system heating model according to an embodiment of the invention.

The data in FIG. 3 is taken by making a measurement M on 17 out of 87 fields F on the substrate W as shown in FIG. 4. The substrate W has been exposed to the radiation beam B' which has passed through the projection system PS. Thus, a measurement may be made on the resist on the substrate W to determine the offset of the focus when compared to the expected optimal focal point. More generally, the thermally induced aberrations of the projection system PS caused by the radiation beam B' are measured after the exposure of one or more exposure fields on the substrate W.

The results of the 17 measurements of each of the 24 substrates W are shown in FIG. 3. It shows that the focus offset increases over time for each substrate W (due to heating of the projection system PS by the radiation beam B') and then decreases (due to the cooling down effect when the radiation beam B' is not passing through the projection system PS) and then increases once more for the next substrate W.

Figure 5:
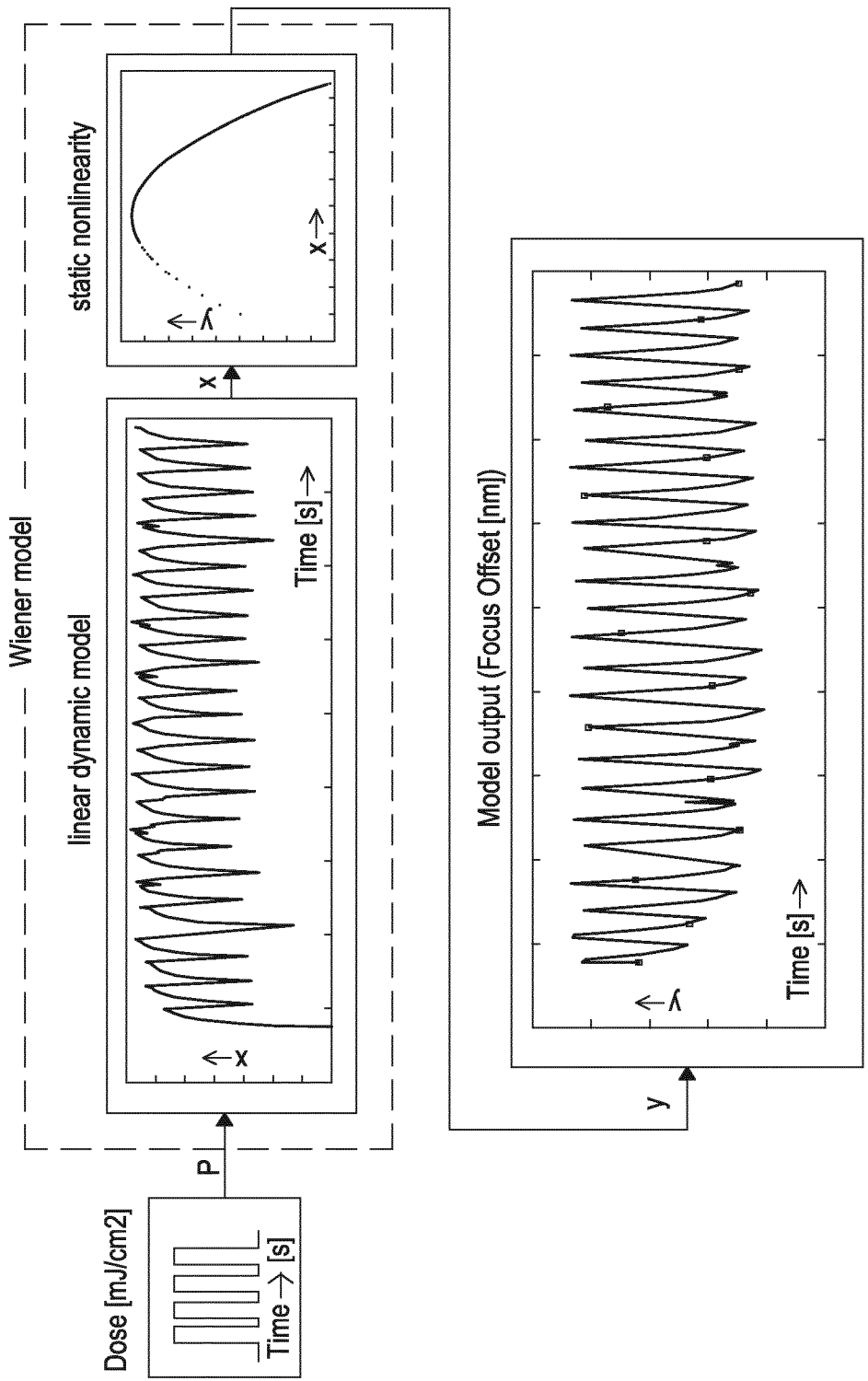
FIG. 5 depicts a schematic diagram of the response of a projection system heating model according to an embodiment of the invention.

FIG. 5 shows the response of the dynamic linear submodel and the static non-linear submodel for parameters which have been determined using an optimization routine. The linear dynamic submodel in FIG. 5 has two linear dynamic functions with different µ amplitudes (nm) and r time constants (s) of the first set of parameters. The first function has a time constant that is very fast, and thus can model the fast mirror heating effects, and the second function has a time constant that is slower, and so can model the slower mirror hearing effects.

Using values of the first parameters in the linear dynamic submodel and the dose (input power P) provides the response as shown in FIG. 5. That is, the response x calculated using the first parameters and power P are shown over time (s) in the graph of the linear dynamic model. This may represent the exposure of 24 (or 25 etc) substrates W, i.e. the temperature sequentially increasing (heating up of projection system PS) and the temperature partially decreasing (partial cooling down of the projection system PS) for exposing the substrates W with the radiation beam B'. FIG. 5 only shows arbitrary values of x and y on the vertical axes but exemplary responses of these arbitrary values are shown.

Using values of the second parameters in the static non-linear model $y(x)=ax^2+bx+c$ provides the response as shown in FIG. 5. That is, the response y calculated using the second parameters are shown for values of x from the dynamic linear model in the graph of the static non-linear model. Finally, the output, y (representing the thermally induced aberrations), from the static non-linear model is shown over time in a model output graph which represents focus offset (nm). The model parameters, µ amplitude (nm) and r time constant (s) of the first set of parameters, and a, b and c of the second set of parameters are calibrated for each image parameter separately. In this example, the measurement data that is fed to the algorithm is focus offset. Therefore, the model output is focus offset. In this case, focus is measured from substrate W exposures. Thus, focus is the combined effect of all focus related aberrations, focus=$Z_4+Z_5+Z_6+Z_9$ etc.

Figure 6:
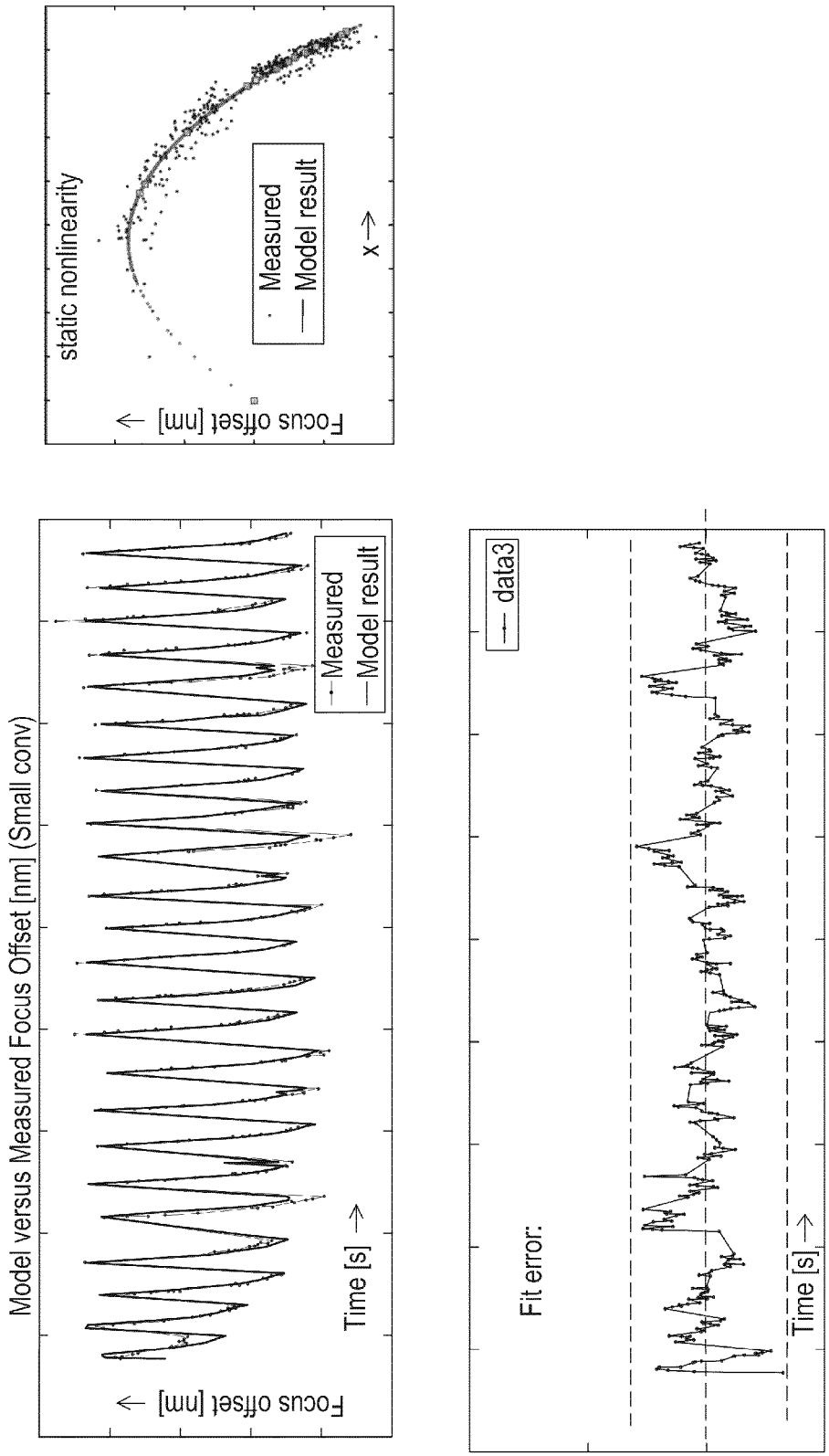
FIG. 6 depicts graphs showing a comparison of measured results of focus offset with a projection system heating model focus offset results according to an embodiment of the invention.

FIG. 6 depicts three graphs showing the focus offset results of the model of FIG. 5 with the measured focus offset results of FIG. 3. That is, with the small conventional illumination mode. The bottom graph of FIG. 6 shows the fit error between the model results and the measured results for focus offset shown in the top left graph of FIG. 6. The model results match the measured resist data quite well. The prediction model is highly accurate (within focal noise). Over time, the fit error between the model and measured results is relatively small. The right hand graph of FIG. 6 shows a comparison between the static non-linear model focus offset results and the measured focus offset results for values of x (representing temperature).

The model of FIG. 2 may be calibrated using the measured results of the focus measured from the resist data. These measured values may be fed back into the predicted model to provide more accurate results. A method for doing this is described below. The measurement of the aberrations of the projection system PS may be used to calibrate the dynamic linear function and the static non-linear function. It will be appreciated that in other embodiments, the model of FIG. 2 may be calibrated using other measures of the thermally induced aberrations, such as field curvature, astigmatism offset and astigmatism curvature.

Figure 7:
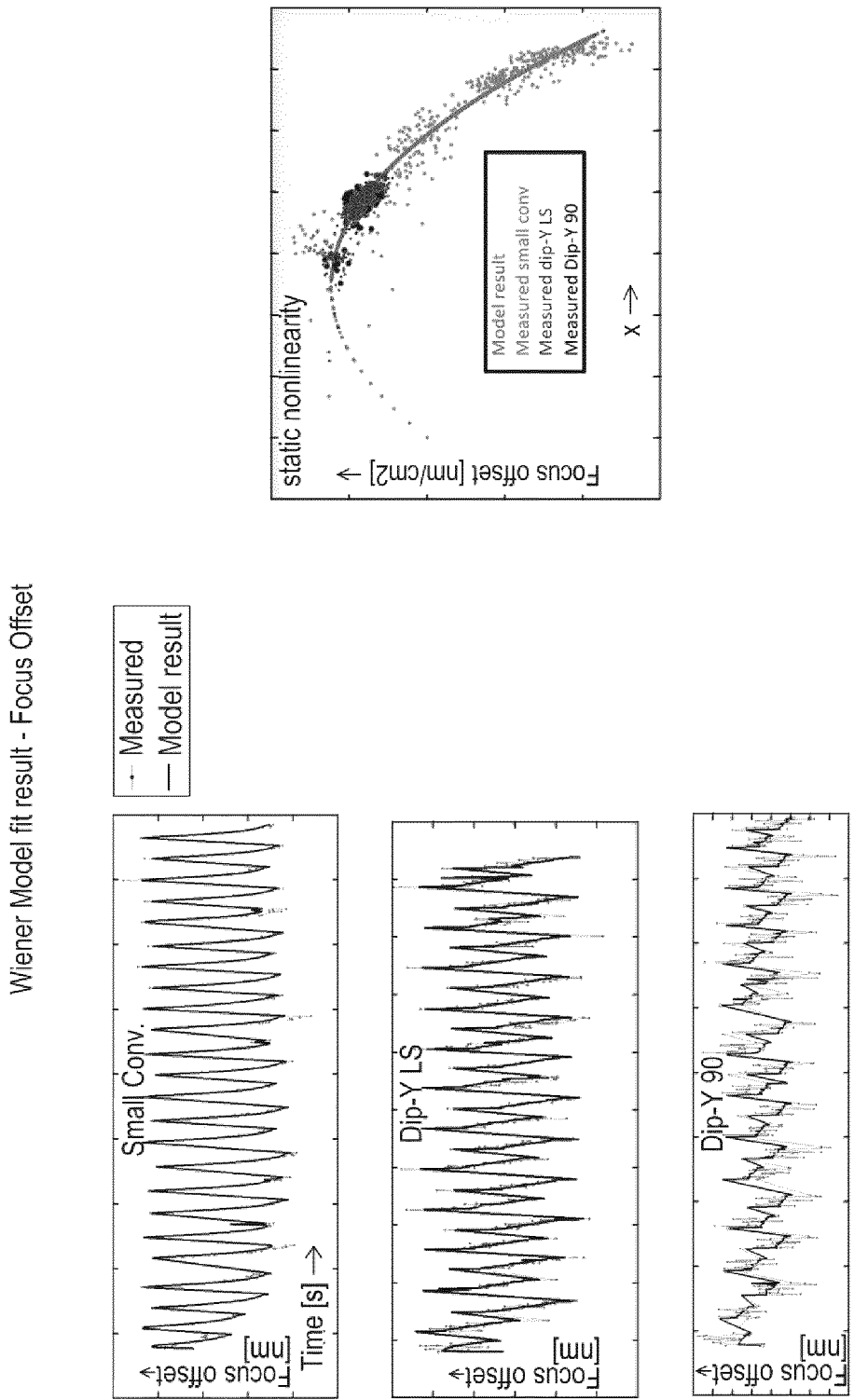
FIG. 7 depicts graphs showing a comparison of measured results of focus offset with a projection system heating model focus offset results for different applications according to an embodiment of the invention.

FIG. 7 depicts three graphs on the left hand side showing the focus offset measured and modeled results for three different applications, i.e. three different illumination modes in this case. The top graph shows the results for the small conventional illumination mode, the middle graph shows the results for the Dipole-Y LS illumination mode, and the bottom graph shows the results for the Dipole-Y 90 illumination mode. The small conventional illumination mode has the largest amplitude for the focus offset, thus it may be used for calibration for focus offset.

The right hand graph of FIG. 7 shows a comparison between the static non-linear model focus offset results and the measured focus offset results for values of x (representing temperature) for each of the three illumination modes. It can be seen that the results for the static nonlinearity are the same for all applications (all illumination modes). That is, the static non-linear function is not application dependent, i.e. it is application independent. This is in contrast with the dynamic linear function, which is application dependent.

The static non-linear function can be used for other application cases as well. The static non-linear relation can be used also to fit the dipole illumination mode cases as well as the small conventional illumination mode case. For the dipole cases we only have to fit the dynamic linear submodel as the static non-linear submodel is the same for different illumination modes (i.e. application independent). The static non-linear function needs to only be calibrated once. Thus, if a new application, e.g. with a new illumination mode, is used in the lithographic apparatus LA, and a static non-linear submodel has already been calculated for the projection system PS, then only the dynamic linear submodel needs to be re-calculated to determine the model results. Thus, the dynamic linear function is application dependent.

The Wiener model fit (i.e. the projection system heating model of FIG. 2) may also be used for other predictions of thermally induced aberrations as well as the focus offset, such as field curvature, astigmatism offset and astigmatism curvature of the thermally induced aberrations.

Figure 8:
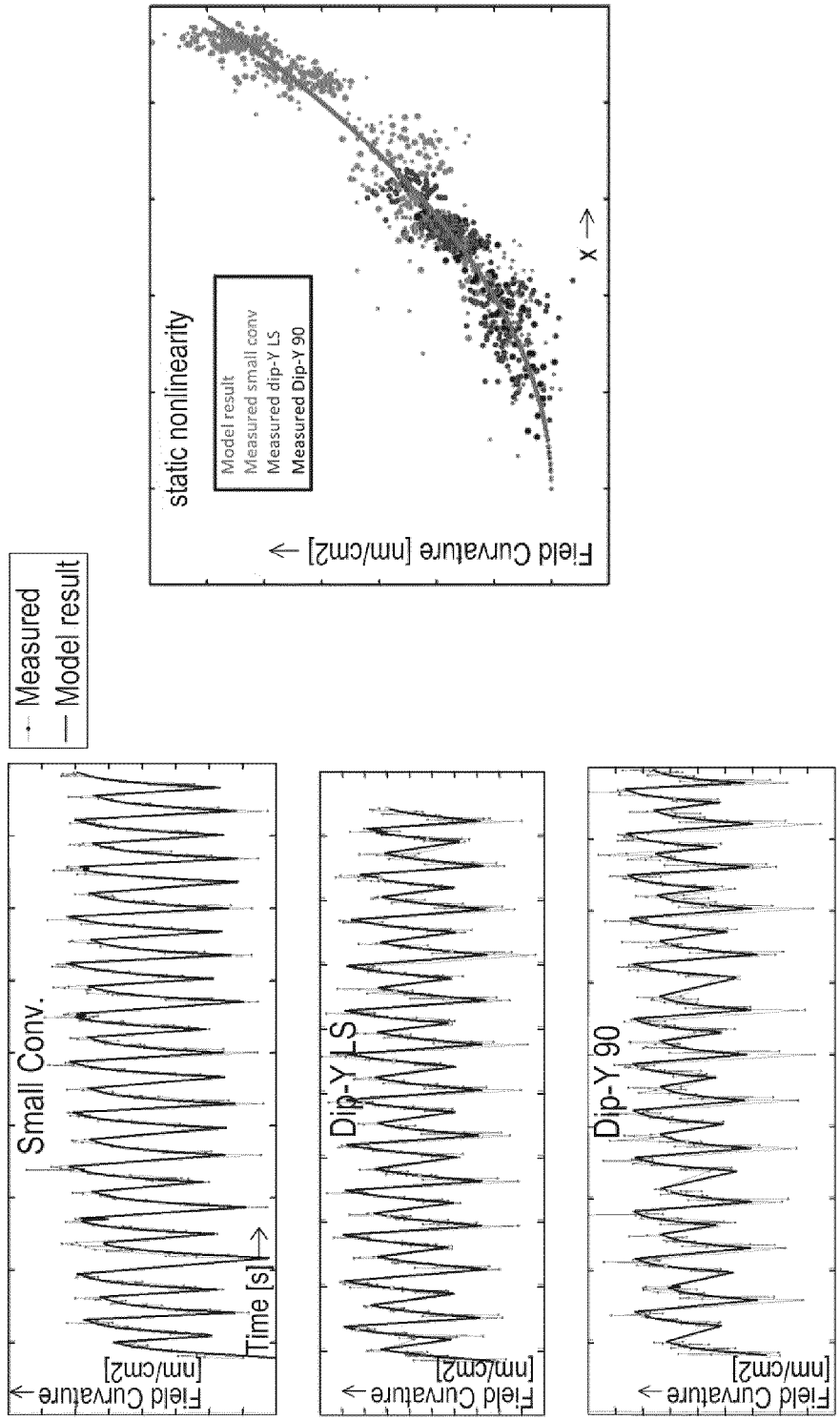
FIG. 8 depicts graphs showing a comparison of measured results of focus curvature with a projection system heating model focus curvature results according to an embodiment of the invention.

FIG. 8 shows the Wiener model fit results for field curvature (nm/cm$^2$) for the small conventional, the Dipole-Y LS, and the Dipole-Y 90 illumination modes. The small conventional illumination mode also has the largest amplitude for the field curvature, thus it may be used for calibration for field curvature.

Figure 9:
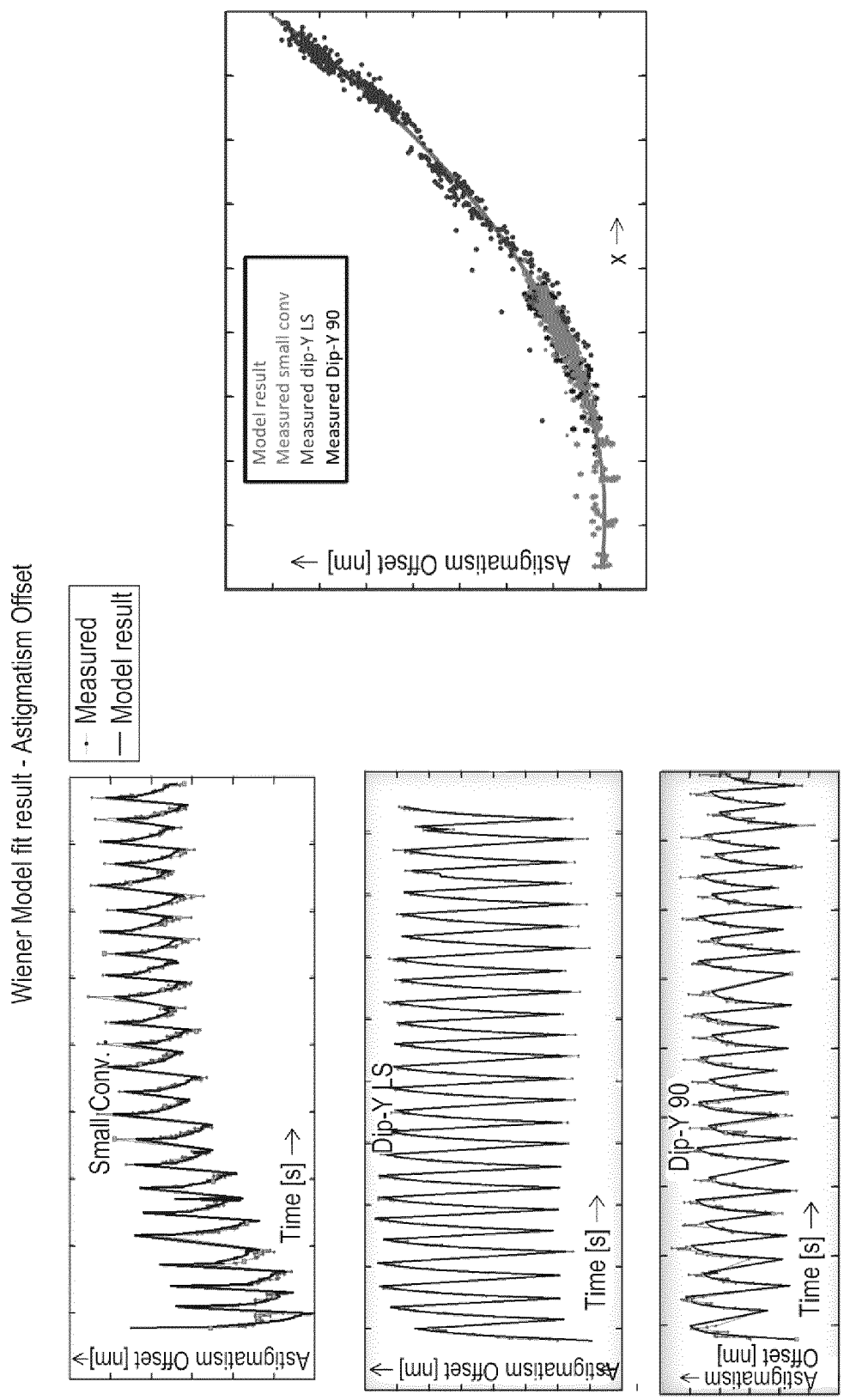
FIG. 9 depicts graphs showing a comparison of measured results of astigmatism offset with a projection system heating model astigmatism offset results according to an embodiment of the invention.

FIG. 9 shows the Wiener model fit results for astigmatism offset (nm) for the small conventional, the Dipole-Y LS, and the Dipole-Y 90 illumination modes. The dipole-Y 90 illumination mode has the largest amplitude for the astigmatism offset, thus it may be used for calibration for astigmatism offset.

Figure 10:
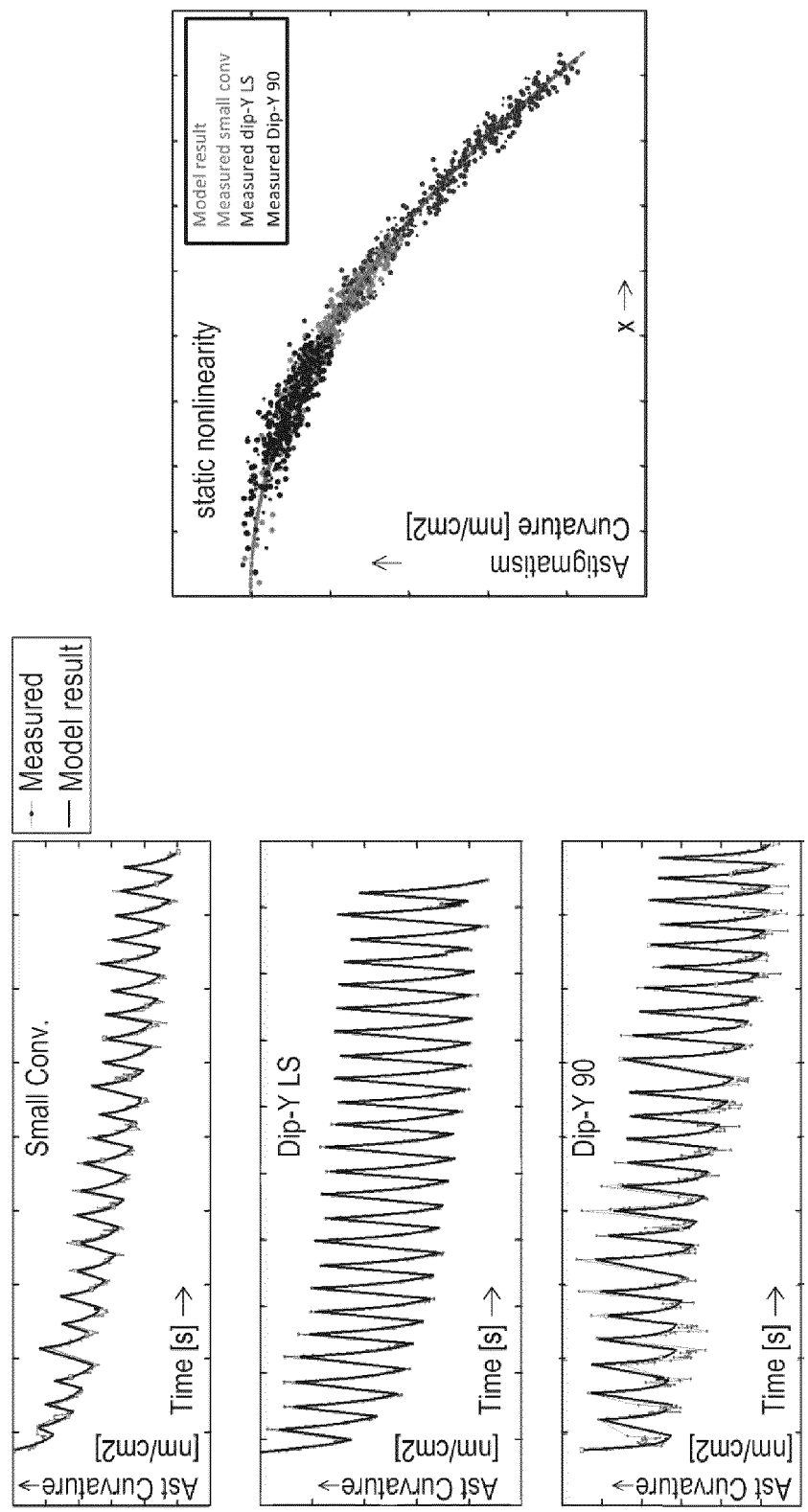
FIG. 10 depicts graphs showing a comparison of measured results of astigmatism curvature with a projection system heating model astigmatism curvature results according to an embodiment of the invention.

FIG. 10 shows the Wiener model fit results for astigmatism curvature (nm/cm$^2$) for the small conventional, the Dipole-Y LS, and the Dipole-Y 90 illumination modes. The dipole-Y 90 illumination mode also has the largest amplitude for the astigmatism curvature, thus it may be used for calibration for astigmatism curvature.

Registration marks on the substrate may also be used to measure the thermally induced aberrations from the exposed substrate W. Based on the resist data (registration marks), both focus drift and/or pattern shift (overlay) drift can be measured. This data may be treated the same way as the sensor data is used to calibrate the mirror heating model.

Figure 11B:
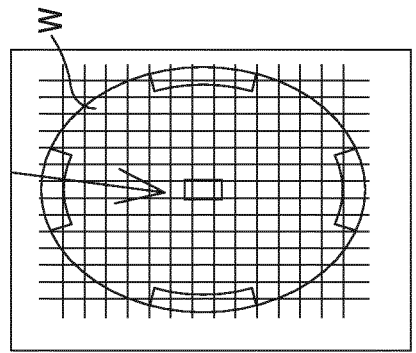
Figure 11A:
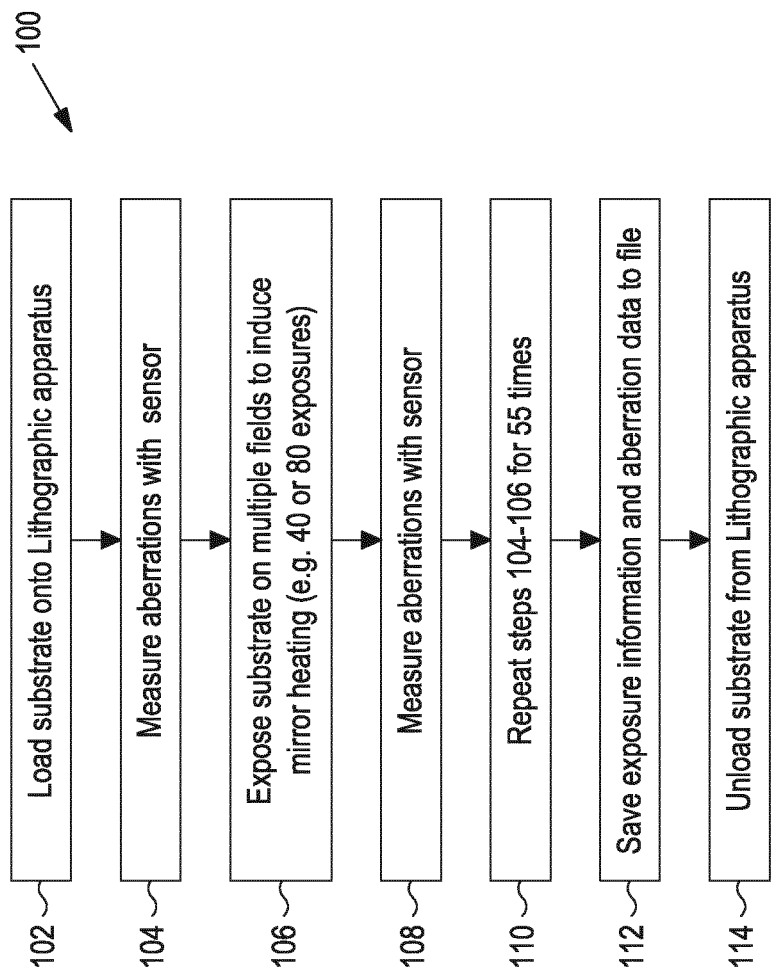
FIG. 11a depicts a flow diagram of a mirror heating qualification test according to an embodiment of the invention.

FIG. 11a depicts a flow diagram of a mirror heating qualification test 100 using a sensor measuring the imaging performance of the radiation beam B' being output from the projection system PS. More particularly, a sensor as described in published PCT application WO2017/207512A2 (e.g. specifically at FIGS. 3A and 3B and paragraphs [0095]-00981) is used for the mirror heating qualification test. The qualification test 100 is a measure and expose sequence that is used to qualify the performance of one or a combination of subsystems. In this case, the sequence is used to calibrate the mirror heating model.

The sensor may be used at substrate level for evaluating and optimizing imaging performance. The sensor is an interferometric wavefront measurement system that may perform static measurements on lens aberrations up to high order. It may be implemented as an integrated measurement system used for system initialization and calibration. Alternatively, it may be used for monitoring and recalibration "on-demand".

It has been shown that the Wiener model can be fitted quite well based on resist data. An advantage of using resist data is that it does not suffer from sample delays. That is, the projection system PS state is instantaneously captured in resist without any delays. However, this requires analyzing the resist after exposure and it is desirable to measure the imaging properties of the projection system PS directly using sensors at substrate level in order to calibrate the model for a particular application and particular lithographic apparatus LA. Sensor data can be measured independently of the structures being printed on the substrate W. Thus, the sensor method can be used with any reticle (patterning device MA). Resist tests such as those using the system and method as described in published PCT application WO2013/056941A1 (measuring focus) require that some marks are available on a suitable reticle. Therefore, resist tests can only be used in combination with dedicated reticles.

Using sensor data is not straightforward as there is sample delay in taking the measurements. Sensor measurements may take about 10 seconds to sample 3 fieldpoints in a slit, i.e. the part of the field that is lit when exposing. In order to measure field curvature, at least 3 points have to be measured in different positions in the field (slit). During this 10 s timeframe, the effects (i.e. the thermally induced aberrations) might have drifted significantly. As seen previously, the most significant time constants may have a magnitude of 5 s. That means that after 5 seconds the effect has reduced by e.g. 68%, so after several seconds the signal to noise ratio might be unsuitable for model calibration.

The qualification test 100 in FIG. 11a is carried out using the sensor. As mentioned, the sensor measurements sample fieldpoints in the slit. More generally, the thermally induced aberrations of the projection system PS caused by the radiation beam B' are measured after the exposure of one or more exposure fields on the substrate W. The wavefront of the radiation beam B' output from the projection system PS is measured using the sensor. The time-averaged power may be increased in the projection system PS. This may be done by maximizing the radiation entering the projection system PS, e.g. by having a high reflectance reticle MA. Furthermore, the projection system PS heating may be maximized and the projection system cooling down times may be minimized A relatively high dose of radiation (e.g. 99 mJ/cm$^2$) may be input to the projection system PS.

In this qualification test 100, before and after each set of wafer exposures (40 dies) sensor measurements are done. This cycle is repeated 55 times which gives, in total, 110 sensor measurements during the test. In this test case a dipole-Y Leaf Shape application is measured. In other embodiments, different illumination modes (applications) may be used. The test may be carried out on only a single substrate W. There may be 40 overlapping exposures in the centre of the substrate W as illustrated by the arrow in FIG. 11b.

In step 102 of the qualification test 100, the substrate W is loaded onto the lithographic apparatus LA. In step 104, the aberrations are measured with e.g. the interferometric sensor. In step 106, the substrate is exposed on multiple fields to induce mirror heating (typical 40 or 80 exposures). In step 108, the aberrations are measured again with the sensor. In step 110, steps 104-106 are repeated 55 times. In step 112, the exposure information and aberration data is saved to file. In step 114, the substrate is unloaded from the lithographic apparatus LA.

For each Zernike, e.g. from $Z_5$ to $Z_{77}$, the Wiener model (i.e. the model of FIG. 2) may be fitted. The aberration results of the projection heating model of FIG. 2 may be fitted against the measured aberration results using the sensor for particular Zernike coefficients.

The model of FIG. 2 may be calibrated using the results of the Zernikes measured using the sensor. These measured values may be fed back into the predicted model to provide more accurate results. Once the model of FIG. 2 has been calibrated, e.g. for a particular application in the lithographic apparatus, the model of FIG. 2 may be used in the control loop method as described above.

In an embodiment, sensor based calibration (e.g. alignment sensor or interferometric sensor data) may be used. The calibration method described here is for sensor based calibration but may also similarly be used for resist based calibration.

In a first step, a set of exposures is executed on one or more substrates W with a particular patterning device MA and other exposure conditions. During the exposure sequence, data is gathered.

The second step is to estimate model parameters ($\mu$, $\tau$, a, b and c) for each relevant Zernike. Whether Zernikes or image parameters, such as focus offset, are predicted depends on the calibration strategy, e.g. sensor based or resist based.

A third step is to deploy the model parameters ($\mu$, $\tau$, a, b and c) to the lithographic apparatus LA. The deployment can be also done on a central database. In the database, model parameters are stored with context information of the calibrated application. Context information can be illumination mode, reticle id, or lithographic apparatus LA id etc.

In a fourth step, the stored data is used. Context information can be used to search for the correct data set for a specific application at run time, during lot production. The model on the lithographic apparatus LA calculates aberration offsets during production. The offsets are calculated using a $\mu$, $\tau$, a, b and c as stored in data base for this specific application. At run time, the heat load is also known within the lithographic apparatus LA (energy as function of time).

In a fifth step, the predicted aberration offsets are corrected using mirror actuators (also reticle stage and wafer stage position). The same model is used to predict the offsets for each exposure separately as long as the lithographic apparatus LA is exposing the same application. When a new application is loaded (new reticle and illumination setting). The corresponding correction set (a $\mu$, $\tau$, a, b and c parameters) are uploaded from the database.

In other embodiments, the thermally induced aberrations of the projection system PS may be measured using a different type of sensor from the interferometric sensor. A number of sensors may be used at substrate level for evaluating and optimizing imaging performance. For example, these may include a sensor as described in published application US2013/0050674A1 (e.g. specifically at FIGS. 3-4 and paragraphs [0062]-[00641]) or spot sensors for measuring exposure radiation dose.

The sensor in US2013/0050674A1 is an alignment sensor that is used to measure the position at substrate level of a projected aerial image of a mark pattern at the mask (reticle) level. The projected image at substrate level may be a line pattern with a line width comparable to the wavelength of the exposure radiation. The alignment sensor measures these mask patterns using a transmission pattern with a photocell underneath it.

Figure 12:
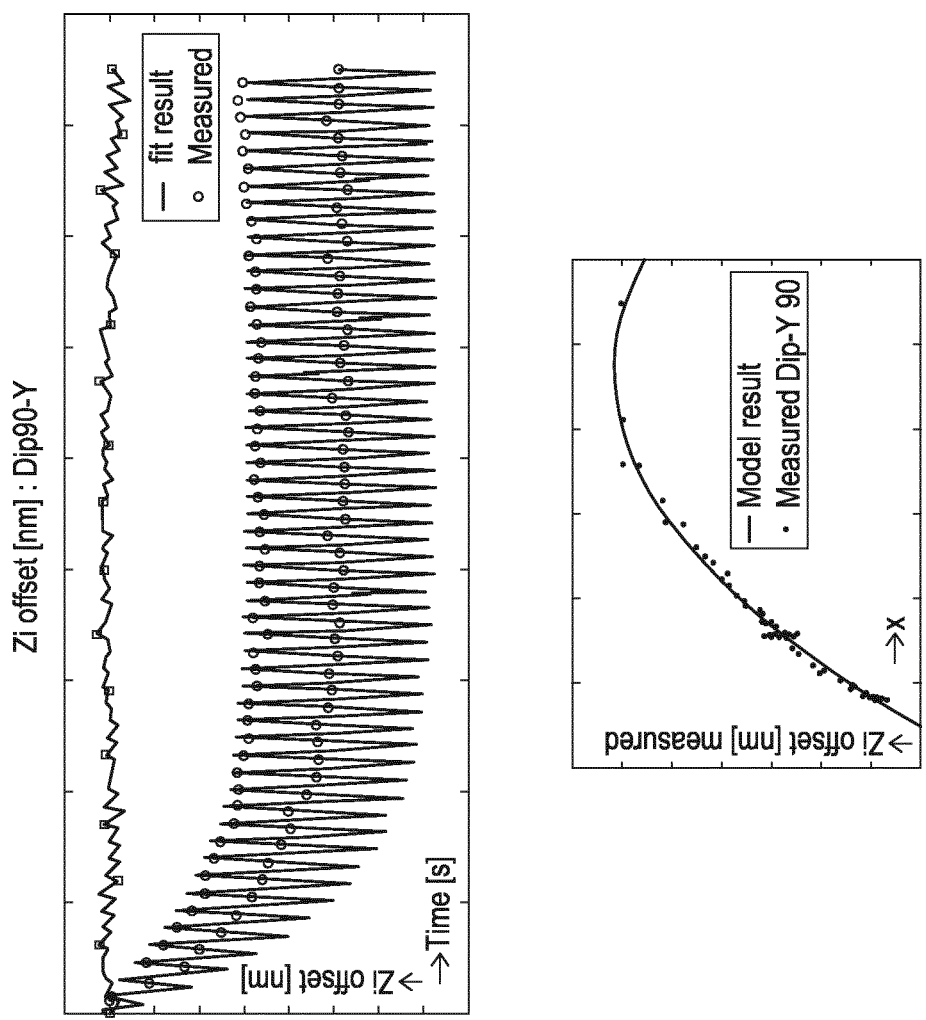
FIG. 12 depicts graphs showing a comparison of measured results of $Z_i$ offset using a sensor with a projection system heating model $Z_i$ offset results according to an embodiment of the invention.

FIG. 12 shows two graphs of the fit results for an arbitrary Zi (Zernike) offset. The illumination mode used is Dipole 90-Y. The top graph shows the $Z_i$ offset over time (s) for both the measured (using the sensor and qualification test of FIG. 11a) and modelled results (using the model of FIG. 2) of the thermally induced aberrations of the projection system PS. The upper most results line on the top graph is the difference between the fit result and the measured result. It can be seen that there is a relatively small error and so the model results fit the measured results relatively well. The bottom graph of FIG. 12 shows the static non-linear model results and measured results for the $Z_i$ offset.

In the case of Z offset, the sample delay is not an issue as the heating and cooling effects are not modified very much over short time scales. However, for a Zernikes with short time constants, then sample delay may be an issue.

Figure 13:
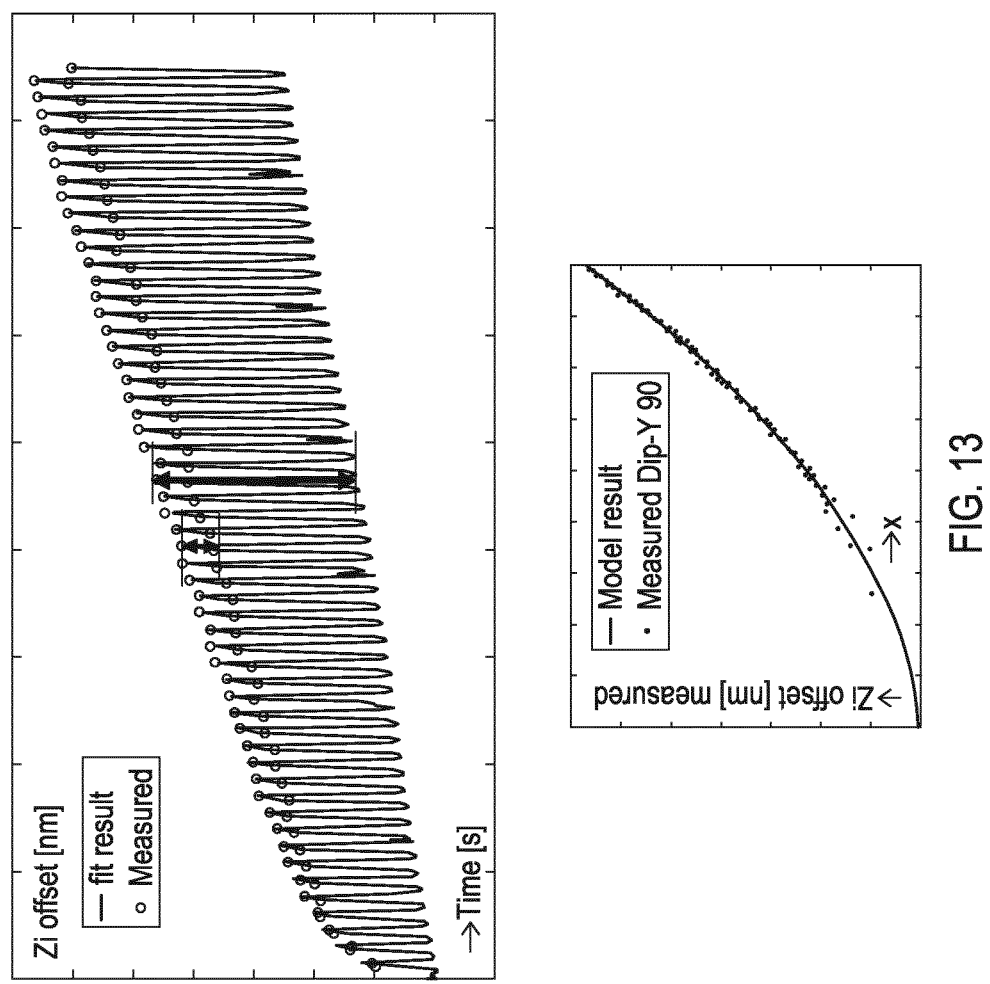
FIG. 13 depicts graphs showing a comparison of measured results of $Z_5$ offset using a sensor with a projection system heating model $Z_i$ offset results according to an embodiment of the invention.

FIG. 13 shows two graphs of the fit results for an arbitrary $Z_i$ (Zernike) offset. The top graph shows the offset over time(s) for both the measured (using the sensor and qualification test of FIG. 11a) and modelled results (using the model of FIG. 2) of the thermally induced aberrations of the projection system PS. In this case, sample delay is becoming critical. The small double headed arrow on the top graph shows the measured intra wafer drift and the large double headed arrow on the top graph shows the predicted (i.e. modelled) intra wafer drift. It can be seen that the measured intra wafer drift is only 16% of the predicted intra wafer drift. Under such conditions, there is uncertainty if the model predicts the drift within a wafer with sufficient accuracy. The bottom graph of FIG. 13 shows the static non-linear model results and measured results for the $Z_i$ offset.

In order to reduce the sample delay, a faster sensor can be used. The faster sensor may include for instance several interferometric sensors in parallel. The faster sensor may measure e.g. 7 field points in the slit within 200 ms. This will solve the delay issues. Another solution using the interferometric sensor is by sampling only a single point in the field (centre field only). This will reduce the sample delay significantly, e.g. by 60%. Another method is to directly measure in resist using registration marks or measure best focus based on focus meander data. Resist data such as focus meander data is used to track the aberration drift through time.

Figure 14A:
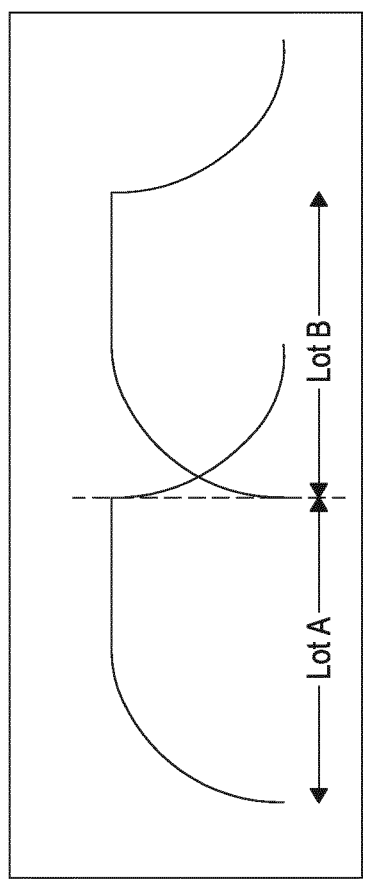
FIG. 14a depicts a schematic diagram of a projection system heating effect for lot transitions.

FIG. 14a shows the projection system PS heating effect for lot transition situations. Lot transitions occur when an application in the lithographic apparatus LA is switched over to a different application. This may be, for example, a first application for Lot A being defined by a particular patterning device MA, illumination mode or product stack used and switching to a second application for Lot B being defined by one or more of a different patterning device MA, illumination mode or product stack. During lot transitions, the mirror heating effect is determined by both the 2 applications. Each application has its own mirror heating model. When switching from one application to another, the cool down effect of previous application (the first application) has to be taken into account, as well as the heating of the current application (the second application).

Figure 14B:
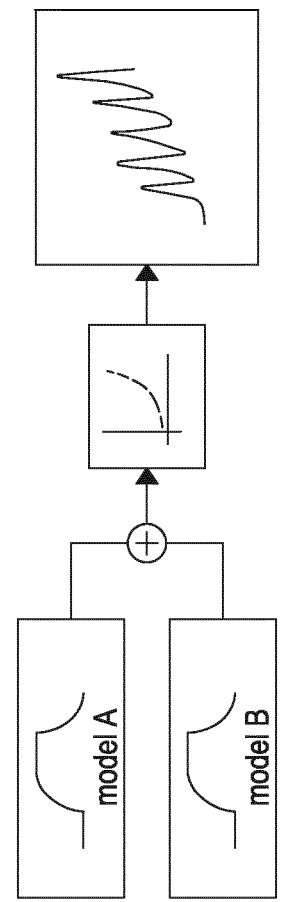
FIG. 14b depicts a schematic diagram of a projection system heating model for lot transitions according to an embodiment of the invention.

FIG. 14b shows a Wiener model representation suitable to model lot transition situations. Non-linear model response cannot simply be added during lot transition to predict the cool down effect during the next lot. However, the dynamic linear submodels (model A for Lot A and model B for Lot B in FIG. 14b) output can be added up. As shown in FIG. 14b, the thermally induced aberrations drift for the transition between the 2 applications can be predicted by adding the response of the 2 dynamic linear blocks (model A and model B), and then evaluating the static non-linear response. In other words, to predict the total non-linear response then the total sum of the dynamic linear submodels can be evaluated through the static non-linear relation. Thus, an advantage of the Wiener model concept for predicting thermal induced aberrations in EUV mirror heating is that is can predict what happens during lot transition and make those predictions accurately.

In this embodiment, the model is calibrated using 24 (or 25) substrates W. However, in other embodiments, the model may be calibrated using a different number of substrates W, such as only one substrate W. This provides a quicker calibration as the substrates W do not need to be switched.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
adjusting a lithographic apparatus to compensate for thermally induced aberrations and/or drift of thermally induced aberrations of a projection system of the lithographic apparatus based on operations using predicted aberrations by:
calculating a change in temperature of the projection system from a power of a radiation beam output from the projection system using a dynamic linear function; and
calculating the thermally induced aberrations from the change in temperature using a static non-linear function;
wherein the adjusting is performed in a control loop system.

2. The method of claim 1, wherein the dynamic linear function is $x(k)=x(k-1)\exp(-dt/\tau)+P(k)\mu/\tau$, with a first set of parameters: $\mu$ being amplitude, $\tau$ being time constant, P being the power of the radiation beam output from the projection system and x representing the change in temperature.

3. The method of claim 2, wherein the static non-linear function is $y(x)=ax^2+bx+c$, with a second set of parameters: a, b, and c of an exponential relation and y representing the thermally induced aberrations.

4. The method of claim 3, further comprising determining $\mu$ and $\tau$ of the first set of parameters of the dynamic linear function and a, b, and c of the second set of parameters of the static non-linear function using a non-linear optimization routine.

5. The method of claim 1, wherein the dynamic linear function is application dependent and the static non-linear function is application independent.

6. The method of claim 1, further comprising predicting thermally induced aberrations for different applications during lot transition by adding a response of the dynamic linear function of a first application and a response of the dynamic linear function of a second application together and then evaluating a static non-linear response using the static non-linear function.

7. The method of claim 1, further comprising:
passing the radiation beam through the projection system to expose one or more exposure fields on a substrate;
measuring the thermally induced aberrations of the projection system caused by the radiation beam; and
using the measurement of the thermally induced aberrations of the projection system to calibrate the dynamic linear function and the static non-linear function.

8. The method of claim 7, further comprising:
measuring the thermally induced aberrations by measuring at least one of focus offset, field curvature, astigmatism offset, astigmatism curvature, and registration marks from the exposed substrate, and
measuring an intensity and/or wavefront of the radiation beam output from the projection system using a sensor.

9. The method of claim 7, further comprising calibrating the dynamic linear function and the static non-linear function using only one substrate.

10. A lithographic apparatus comprising:
a projection system configured to pass a radiation beam to project a pattern from a patterning device onto a substrate, wherein the lithographic apparatus is configured to predict thermally induced aberrations of the projection system by:
using a dynamic linear function to calculate a change in temperature of the projection system from a power of a radiation beam output from the projection system using a dynamic linear function, and
using a static non-linear function to calculate the thermally induced aberrations from the calculated change in temperature.

11. The lithographic apparatus of claim 10, wherein the lithographic apparatus is configured to:
make measurements of the thermally induced aberrations of the projection system caused by the radiation beam being passed through the projection system to expose one or more exposure fields on the substrate; and
use the measurement of the thermally induced aberrations of the projection system to calibrate the dynamic linear function and the static non-linear function.

12. The lithographic apparatus of claim 11, wherein the lithographic apparatus is further configured to:
measure the thermally induced aberrations by measuring at least one of focus offset, field curvature, astigmatism offset, astigmatism curvature, and registration marks from the exposed substrate; and
measure an intensity and/or wavefront of the radiation beam output from the projection system using a sensor.

13. The lithographic apparatus of claim 11, wherein the lithographic apparatus is further configured to calibrate the dynamic linear function and the static non-linear function using only one substrate.

14. The lithographic apparatus of claim 10, wherein the lithographic apparatus is configured to use the predicted thermally induced aberrations in a control loop system to compensate for the thermally induced aberrations and/or a drift in the thermally induced aberrations of the projection system.

15. The lithographic apparatus of claim 10, wherein:
the lithographic apparatus is an extreme ultra violet lithographic apparatus; and
the projection system comprises mirrors.

16. The lithographic apparatus of claim 10, wherein the dynamic linear function is $x(k)=x(k-1)\exp(-dt/\tau)+P(k)\mu/\tau$, with a first set of parameters: $\mu$ being amplitude, $\tau$ being time constant, P being the power of the radiation beam output from the projection system and x representing the change in temperature.

17. The lithographic apparatus of claim 16, wherein the static non-linear function is $y(x)=ax^2+bx+c$, with a second set of parameters: a, b, and c of an exponential relation and y representing the thermally induced aberrations.

18. The lithographic apparatus of claim 17, wherein the lithographic apparatus is further configured to determine $\mu$ and $\tau$ of the first set of parameters of the dynamic linear function and a, b, and c of the second set of parameters of the static non-linear function using a non-linear optimization routine.

19. The lithographic apparatus of claim 10, wherein the dynamic linear function is application dependent and the static non-linear function is application independent.

20. The lithographic apparatus of claim 10, wherein the lithographic apparatus is further configured to predict thermally induced aberrations for different applications during lot transition by adding a response of the dynamic linear function of a first application and a response of the dynamic linear function of a second application together and then evaluating a static non-linear response using the static non-linear function.

* * * * *

UNITED STATES PATENT AND TRADEMARK OFFICE
CERTIFICATE OF CORRECTION

PATENT NO. : 12,078,938 B2
APPLICATION NO. : 17/438314
DATED : September 3, 2024
INVENTOR(S) : Akhssay et al.

It is certified that error appears in the above-identified patent and that said Letters Patent is hereby corrected as shown below:

In the Specification

In Column 6, Line 38, delete "r" and replace with --$\tau$--.

In Column 8, Line 20, delete "r" and replace with --$\tau$--;

In Column 8, Line 47, delete "r" and replace with --$\tau$--.

In Column 10, Line 12, delete "[0095]-[00981)" and replace with --[0095]-[0098])--.

In Column 11, Line 1, delete "minimized" and replace with --minimized.--.

In Column 12, Line 33, delete "Z" and replace with --$Z_i$--;

In Column 12, Line 38, after "the" insert --$Z_i$--.

Signed and Sealed this
Fifteenth Day of October, 2024

Katherine Kelly Vidal
*Director of the United States Patent and Trademark Office*